(12) United States Patent
Horie et al.

(10) Patent No.: US 6,650,004 B1
(45) Date of Patent: Nov. 18, 2003

(54) SEMICONDUCTOR DEVICE

(75) Inventors: Yoshitaka Horie, Kyoto (JP); Masahide Maeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/111,567

(22) PCT Filed: Oct. 2, 2000

(86) PCT No.: PCT/JP00/06858

§ 371 (c)(1),
(2), (4) Date: Apr. 26, 2002

(87) PCT Pub. No.: WO01/31704

PCT Pub. Date: May 3, 2001

(30) Foreign Application Priority Data

Oct. 28, 1999 (JP) .............................. 11-306341
Apr. 27, 2000 (JP) ........................ 2000-126742

(51) Int. Cl.⁷ .............................. H01L 23/495
(52) U.S. Cl. .................. 257/666; 257/676; 257/692
(58) Field of Search ............... 257/666, 676, 257/668, 675, 787, 692

(56) References Cited

U.S. PATENT DOCUMENTS 5,821,611 A  10/1998  Kubota et al.
6,420,779 B1 *  7/2002  Sharma et al. .............. 257/666

FOREIGN PATENT DOCUMENTS

| JP | 60-101958 | 6/1985 |
| JP | 3-21854 | 3/1991 |
| JP | 4-134857 | 12/1992 |
| JP | 05-121615 | 5/1993 |
| JP | 08-139245 | 5/1996 |
| JP | 08-148621 | 6/1996 |
| JP | 08-162580 | 6/1996 |
| JP | 08-186217 | 7/1996 |
| JP | 08-236672 | 9/1996 |
| JP | 08-264698 | 10/1996 |

* cited by examiner

Primary Examiner—Roy Potter
(74) Attorney, Agent, or Firm—Merchant & Gould P.C.

(57) ABSTRACT

A semiconductor device (S1) includes a semiconductor chip (5), a chip-mounting internal lead (1) mounting the semiconductor chip (5), chip-connecting leads (2, 3) electrically connected to an upper surface of the semiconductor chip (5), and a rectangular resin package 7 housing the semiconductor chip (5) and the internal leads (1 to 3). The chip-mounting internal lead (1) has an end which is rectangular or substantially rectangular and extends along the length of the resin package (7).

8 Claims, 9 Drawing Sheets

SEMICONDUCTOR DEVICE

TECHNICAL FIELD

This invention relates to a surface mount type semiconductor device usable as a diode, transistor and so on.

BACKGROUND ART

Up to now, surface mount type semiconductor devices have been proposed to be used as diodes, transistors and so on. One example of such semiconductor devices is shown in FIG. 16 to FIG. 18 of the accompanying drawings. The semiconductor device S may be a transistor, comprising an internal lead 91 as a base terminal, an internal lead 92 as a collector terminal, and an internal lead 93 as an emitter terminal.

The internal terminals 91, 92 and 93 are juxtaposed and are flush with one another. A substantially rectangular island 94 is formed at one end of the internal lead 91. A semiconductor chip 95 (also called a "pellet") is die-bonded onto the island 94 using a gold wire W or the like, and is electrically connected to the internal leads 92 and 93. The semiconductor chip 95, gold wire W and internal leads 91–93 are housed in a resin package 97 made of thermosetting epoxy resin or the like. The internal leads 91 to 93 are folded and are respectively connected to external leads 11 to 13 on the outer surface of the resin package 97.

The semiconductor chip 95 generates heat as the semiconductor device S is operated. Especially, if the semiconductor device S is used as a power transistor, the generated heat should be efficiently radiated to the exterior of the resin package 97 in order to assure reliable operation of the semiconductor chip 95.

With the semiconductor device S, the semiconductor chip 95 is mounted on the island 94, which functions as a radiator for dissipating heat via the internal lead 91 or via the resin package 97 in contact with the internal lead 91. In this case, the island 94 preferably has a large upper surface area in order to promote heat radiation. Further, there has been a demand to enlarge the semiconductor chip 95 in order to improve the performance of electronic circuits integrated therein. Therefore, the island 94 is required to have a large upper surface area.

In order to increase the plane area of the island 94, it is conceivable to make the internal leads 92 and 93 juxtaposed on the island 94 smaller. However, both the island 94 and the internal leads 92 and 93 are positioned to be substantially flush with one another so that they are connected by gold wires W or the like. Naturally it is impossible to enlarge the island 94 without limit. At present, the upper surface area of the internal lead 91 occupies approximately 40% of the area of base of the resin package 97 at the most. As a result, it has been requested to increase the foregoing occupancy ratio in order to promote heat radiation.

DISCLOSURE OF THE INVENTION

It is an object of the invention to provide a semiconductor device which can overcome the foregoing problems of the related art or at least reduce those problems.

According to a first aspect of the invention, there is provided a semiconductor device comprising: a semiconductor chip; a chip-mounting internal lead having the semiconductor chip mounted thereon; chip-connecting internal leads which are electrically connected to an upper surface of the semiconductor chip; and a rectangular resin package which houses the semiconductor chip and the internal leads. In the semiconductor device, the chip-mounting internal lead includes one end which is rectangular or substantially rectangular along the length of the resin package.

An upper surface area of the chip-mounting lead is preferably equal to or larger than approximately 50% of an area of base of the resin package.

In this arrangement, the semiconductor device has a so-called wireless structure in which the chip-connecting internal leads are connected to the upper surface of the semiconductor chip on the chip-mounting internal lead. One end of the chip-mounting internal lead is rectangular or substantially rectangular along the length of the rectangular resin package. The upper surface area of the chip-mounting internal lead can be increased as desired. Therefore, heat generated by the semiconductor chip can be dissipated outward via the enlarged chip-mounting internal lead or via the resin package in contact with the chip-mounting internal lead. This improves the heat radiation of the semiconductor device. Further, the chip-connecting internal leads are directly connected to the semiconductor chip. For this reason it is possible to dissipate heat from the semiconductor chip through the chip-connecting internal leads, which contributes to improvement of heat radiation.

In a preferred embodiment of the invention, the semiconductor chip is mounted at the center of the chip-mounting internal lead extending along the length of the resin package.

In this arrangement, heat generated by the semiconductor chip is radiated widely along the length of the resin package (to the right and left) via the chip-mounting internal lead, compared with a case where the semiconductor chip is eccentrically mounted on the chip-mounting internal lead.

With a further preferred embodiment of the invention, a width of a non-end portion of the chip-mounting lead is equal to a width of the end.

This structure promotes heat radiation from the chip-mounting lead to the exterior.

According to a second aspect of the invention, there is provided a semiconductor device comprising: first and second semiconductor chips; first and second chip-mounting internal leads having the first and second semiconductor chips, respectively, mounted thereon; a plurality of chip-connecting internal leads which are electrically connected to upper surfaces of the first and second semiconductor chips; and a rectangular resin package housing the first and second semiconductor chips and the first and second internal leads. Each of the first and second chip-mounting internal leads includes one end which is rectangular or substantially rectangular along the length of the resin package.

It is preferable that an upper surface area of each end of the chip-mounting leads is equal to or larger than approximately 50% of an area of base of the resin package.

When a plurality of semiconductor chips are provided in the resin package, the chip-mounting internal leads for the semiconductor chips have ends thereof which are rectangular or substantially rectangular along the length of the resin package. The semiconductor device of the second aspect can have the wireless structure similarly to that of the first aspect. Therefore, the upper surface area of each end of the chip-mounting internal leads can occupy approximately 50% or more of the area of the base of the resin package. This is effective in dissipating heat generated by the semiconductor chips to the exterior of the semiconductor device.

In a still further embodiment, ends of the first and second chip-mounting internal leads are positioned to be flush with each other, so that the first and second semiconductor chips are juxtaposed in the resin package.

When a plurality of semiconductor chips are juxtaposed to be flush with one another, the semiconductor device can have a large upper surface area. However, the wireless structure effectively suppresses the enlargement of the upper surface area of the semiconductor device even when the semiconductor chips are juxtaposed in the resin package. This can substantially downsize the semiconductor device.

In a further embodiment of the invention, one end of either the first or second chip-connecting internal lead extends over the two upper surfaces of the first and second semiconductor chips, to thereby connect these upper surface together.

The ends of the chip-mounting internal leads are positioned to be flush with one another, which enables the semiconductor chips to be juxtaposed. This means that the upper surfaces of the semiconductor chips are positioned on the chip-mounting internal leads, so that the chip-connecting internal leads can extend over the upper surface of the semiconductor chips, and the upper surfaces of the semiconductor chips can be connected with one another. In other words, signal terminals of the semiconductor chips can be used in common, which is effective in reducing the number of external terminals of the semiconductor device. As a result, it is possible to reduce the component costs.

In a still further embodiment of the invention, the first and second semiconductor chips are positioned in the resin package with their upper surfaces facing in opposite directions. One end of the first chip-mounting internal lead is positioned near the bottom of the resin package while one end of the second chip-mounting internal lead is positioned near the upper part of the resin package.

The semiconductor chips are positioned with their upper surfaces facing in opposite directions, which means that the chip-mounting internal leads are longitudinally separated from each other in the resin package. This structure enables heat generated by the semiconductor chips to be more efficiently dissipated, compared with the structure in which the internal leads are eccentrically arranged in the resin package. Therefore, it is possible to improve radiation of heat generated by the semiconductor chips via the chip-mounting internal leads.

Other effects and advantages of the present invention will become apparent from the following detailed description of the invention when considered in conjunction with the accompanying drawings.

BEST MODE FOR CARRYING OUT THE INVENTION

Figure 1:
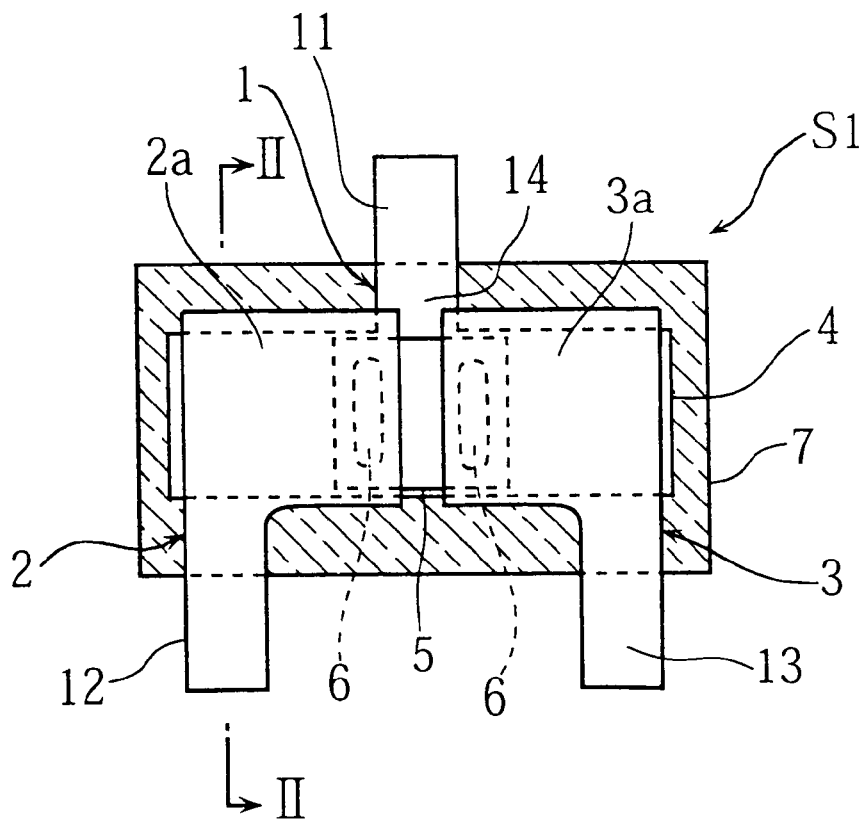
FIG. 1 shows an internal structure of a semiconductor device according to a first embodiment of the invention.

The invention will be described with reference to preferred embodiments shown in the accompanying drawings. Like or corresponding parts are denoted by the same reference numerals.

Figure 2:
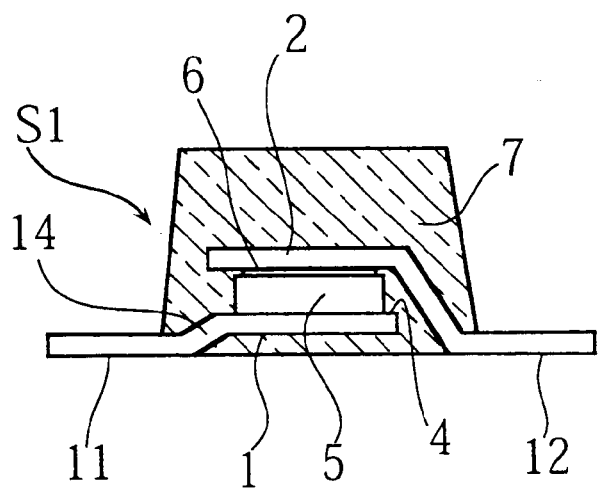
FIG. 2 shows the internal structure of the semiconductor device of FIG. 1, taken along line II—II.
Figure 3:
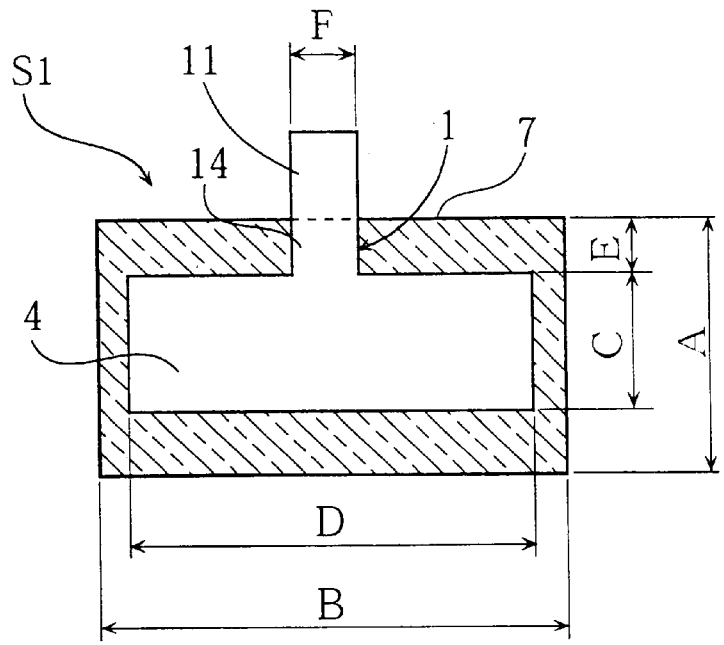
FIG. 3 is a drawing for describing a ratio of an upper surface area of a chip-mounting internal lead to an area of the base of the resin package.

FIG. 1 to FIG. 3 show a semiconductor device S1 according to a first embodiment. The semiconductor device S1 comprises a chip-mounting internal lead 1 for mounting a semiconductor chip 5, a chip-connecting internal lead 2 electrically connected to an upper surface of the semiconductor chip 5, and another chip-connecting internal lead 3. When the semiconductor device S1 is used as a transistor, the chip-mounting internal lead 1 corresponds to a base terminal (or a gate terminal), for example. The chip-connecting internal lead 2 corresponds to a collector terminal (or a drain terminal) while the chip-connecting internal lead 3 corresponds to an emitter terminal (or a source terminal).

Figure 16:
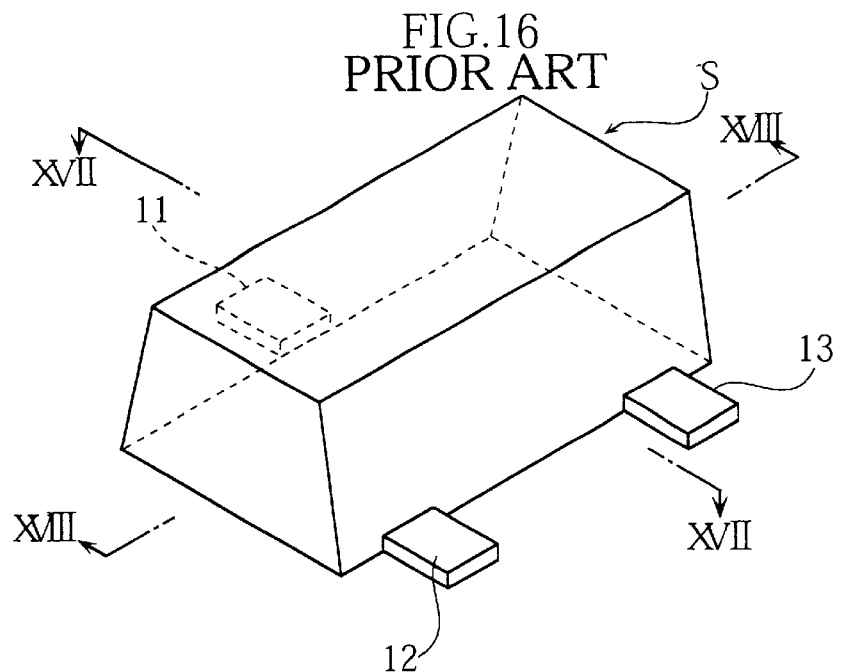
FIG. 16 is a perspective view of a semiconductor device of the related art.
Figure 17:
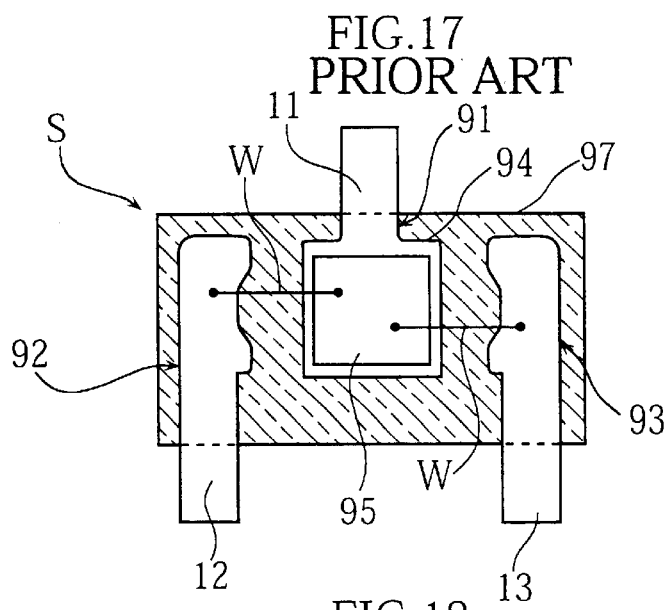
FIG. 17 shows an internal structure of the semiconductor device of FIG. 16, taken along line XVII—XVII.
Figure 18:
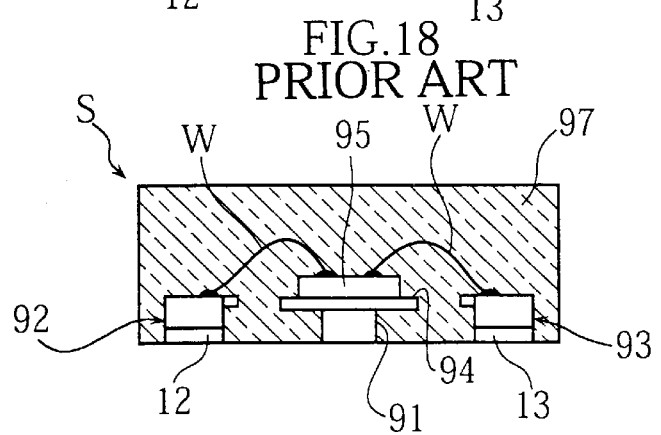
FIG. 18 shows the internal structure of the semiconductor device of FIG. 16, taken along line XVIII—XVIII.

The chip-mounting internal lead 1 is provided with an island 4 at one end thereof for mounting the semiconductor chip 5. The semiconductor chip 5 and the internal leads 1 to 3 are sealed and molded using a thermosetting epoxy resin, which serves as a rectangular resin package 7. External leads 11 to 13 connect to the internal leads 1 to 3 and are provided outside the resin package 7. The semiconductor device S1 has a shape similar to that of the semiconductor device S shown in FIG. 16.

The chip-mounting internal lead 1 has the other end thereof folded, and is connected to the external lead 11 which is exposed on the resin package 7. The chip-mounting internal lead 1 and the external lead 11 are made of copper or the like having excellent heat conduction. The island 4 at one end of the chip-mounting lead 1 is rectangular or substantially rectangular along the length of the resin package 7, and has a large upper surface area. The semiconductor chip 5 is mounted at the center of the island 4 extending along the length of the resin package 7.

The chip-connecting internal lead 2 has a slightly wider flat part 2a at one end thereof while the chip-connecting internal lead 3 has a slightly wider flat part 3a at one end thereof. The chip-connecting internal leads 2 and 3 connect to the external leads 12 and 13 via the other ends thereof.

The chip-connecting internal leads 2 and 3 and the external leads 12 and 13 are made of copper or the like having the excellent thermal conduction, similarly to the chip-mounting lead 1 and the external lead 11.

The flat parts 2a and 3a of the chip-connecting leads 2 and 3 overlap with the semiconductor chip 5 mounted on the island 4, and are electrically connected to the upper surface of the semiconductor chip 5 via a bump 6. In this embodiment, the semiconductor chip 5 is connected to the chip-mounting internal leads 2 and 3 without using wires which were used in the related art, i.e. the wireless structure is employed. Specifically, the semiconductor chip 5 is mounted on the chip-mounting internal lead 1, and the chip-connecting internal leads 2 and 3 are connected to the upper surface of the semiconductor chip 5. It is therefore possible to have a three-dimensional structure where the semiconductor chip 5 is sandwiched from above and below between the internal leads 1 to 3.

The use of the wireless structure enables the chip-mounting internal lead 1 to have as large an upper surface area as possible. As described above, the island 4 can be made rectangular or substantially rectangular lengthwise of the resin package 7. The upper surface area of the chip-mounting lead 1 can occupy approximately 50% or more (to be described later) of the area of the base of the resin package 7. Therefore, heat can be effectively dissipated to the exterior from the semiconductor chip 5 via the enlarged chip-mounting lead 1 or via the resin package 7 in contact with the chip-mounting internal lead 1. It is thus possible to improve the heat radiation of the semiconductor device S1.

Further, the semiconductor chip 5 is mounted at the center of the chip-mounting internal lead 1 which extends along the length of the resin package 7. Therefore, heat generated by the semiconductor chip 5 is laterally dissipated along the length of the resin package 7 (i.e. to the left and right of the resin package 7). Therefore, heat can be more efficiently radiated compared with a case where the semiconductor chip 5 is eccentrically mounted the chip-mounting internal lead 1.

The chip-connecting internal leads 2 and 3 are directly connected to the semiconductor chip 5, so that heat generated by the semiconductor chip 5 can be dissipated outward via the internal leads 2 and 3. Therefore, heat generated by the semiconductor chip 5 can be more efficiently radiated, compared with the case where heat radiation is mainly performed via the chip-mounting internal lead.

Effects of heat radiation will now be described using concrete numerical values. Specifically, degrees of heat radiation will be assessed by comparing the upper surface area of the chip-mounting lead 1 and the area of the base of the resin package 7. It is assumed here that the upper surface area of the chip-mounting internal lead 1 includes the area of the island 4, and the area of a section connected to the island 4 and extending inside the semiconductor device S1 (hereafter called connecting lead 14). Since the chip-mounting lead 1 is actually folded, the upper surface area of the connecting lead 14 differs from an actual upper surface area thereof. Therefore, it is also assumed here that the chip-mounting internal lead 1 is not folded.

FIG. 3 illustrates the ratio of the upper surface area of the chip-mounting lead 1 to the area of base of the resin package 7. Referring to FIG. 3, the area of the base of the resin package 7 is derived by multiplying the depth A and the width B. The upper surface area of the chip-mounting lead 1 is a total of the areas of the island 4 and the connecting lead 14. In short, the upper surface area of the island 4 is derived by multiplying the depth C and the width D. Further, the upper surface area of the connecting lead 14 is derived by multiplying the depth E and the width F.

Table 1 lists specific values of the items A to F. Referring to Table 1, the area SA of base of the resin package 7 is 4.56 mm$^2$. The width F of the connecting lead 14 is 0.4 mm. The upper surface area SB of the chip-mounting internal lead 1 is 2.38 mm$^2$. Therefore, the ratio of the upper surface area SB of the chip-mounting lead 1 to the area SA of base of the resin package 7, SB/SA, is 51.9%.

TABLE 1

| | Length of Side (mm) | | | | | | Area (mm$^2$) | | Rate (%) |
| --- | --- | --- | --- | --- | --- | --- | --- | --- | --- |
| | A | B | C | D | E | F | SA | SB | SB/SA |
| 1st Embodiment | | | | | | 0.4 | | 2.38 | 51.9 |
| 2nd Embodiment | 1.6 | 2.85 | 0.925 | 2.45 | 0.225 | 1.2 | 4.56 | 2.57 | 56.4 |
| 3rd Embodiment | | | | | 2.45 | | | 2.89 | 63.4 |

The ratio of the upper surface area SB of the chip-mounting lead 1 is larger by approximately 10% than the ratio of approximately 40% of the upper surface area of the chip-mounting internal lead of the related art. It can be understood that heat radiation is remarkably improved in the semiconductor device of the present invention. Experiments were performed. Radiated energy (radiating power) was doubled in the semiconductor device S1 of the present invention, compared with the semiconductor device of the related art in which the chip-mounting internal lead 1 is connected using a wire. This proves that heat radiation performance is approximately doubled.

The semiconductor device S1 will be manufactured in the following process. First, a thin copper plate is punched, pressed and shaped as predetermined in order to obtain chip-mounting leads 1. In this case, each of the chip-mounting leads 1 is shaped in order to have the rectangular island 4 at one end thereof. In this state, a plurality of chip-mounting leads 1 are joined by tie bars, and are in the shape of a strip extending in a predetermined direction. Further, another thin copper plate is punched, pressed and shaped in order to obtain the chip-connecting internal leads 2 and 3, which include flat parts 2a and 3a at their ends.

Thereafter, the semiconductor chips 5 are connected to the upper surface of the island 4 of the chip-mounting lead 1, using an adhesive, for example. The chip-mounting internal leads 2 and 3 are connected to the upper surface of the semiconductor chip 5. Specifically, Ag bumps 6 are formed on the semiconductor chip 5 by an electrolytic plating process. The two bumps 6 are symmetrically formed at ends of the semiconductor chip 5 along the length of the semiconductor chip 5. A solder paste is fused on one of the bumps 6 in order to connect the flat part 2a of the chip-connecting internal lead 2. The flat part 3a of the chip-connecting internal lead 3 is also connected by fusing the solder plate on the other bump 6.

The semiconductor chip 5 and the internal leads 1 to 3 are then packed in a thermosetting epoxy resin or the like using a mold, thereby forming the resin package 7. Thereafter, the external leads 11 to 13 exposed from the resin package 7 are soldered. Unnecessary parts such as tie bars are removed, so that the semiconductor device S1 as shown in FIGS. 1 and 2 can be manufactured.

Figure 4:
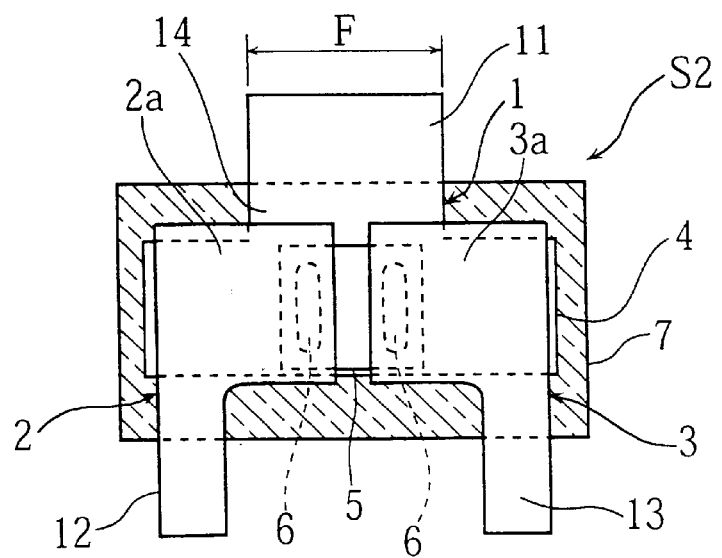
FIG. 4 shows an internal structure of a semiconductor device according to a second embodiment of the invention.

FIG. 4 shows an internal structure of a semiconductor device S2 according to a second embodiment of the invention. Width F of a connecting lead 14 connected to an island 4 is larger than that of the connecting lead of the semiconductor device S1 of the first embodiment. In this case, a chip-mounting lead 1 is wider than that of the first embodiment.

In the second embodiment, referring to TABLE 1, the width F of the connecting lead 14 is 1.2 mm while the upper surface area SB of the chip-mounting lead 1 is 2.57 mm$^2$. Therefore, the ratio of the upper surface area SB of the chip-mounting lead 1 to the area SA of base of the resin package 7, i.e. SB/SA, is 56.4%. The upper surface area of the chip-mounting internal lead 1 is further increased compared with that of the semiconductor device S1 of the first embodiment.

Figure 5:
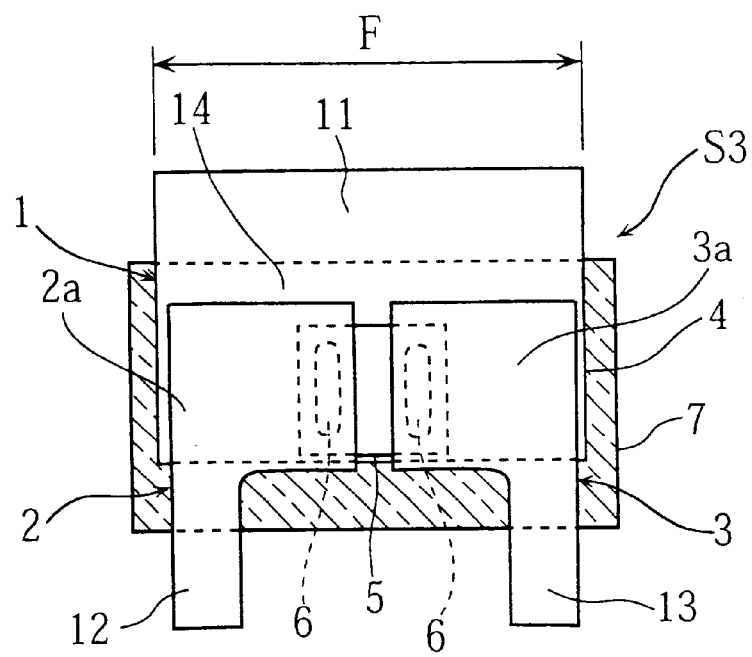
FIG. 5 shows an internal structure of a semiconductor device according to a third embodiment of the invention.

In a third embodiment, a semiconductor device S3 has an internal structure as shown in FIG. 5. Referring to FIG. 5, the width F of a connecting lead 14 is further increased compared with those of the semiconductor devices S1 and S2 of the first and second embodiments. In other words, the chip-mounting lead 1 is designed so that the width F of the chip-connecting lead 14 is substantially equal to a width of an island 4.

Referring to TABLE 1, the width F of the island 4 is equal to the width D of the chip-mounting lead 1, i.e. 2.45 mm, and the upper surface area SB of the chip-mounting lead 1 is 2.89 mm$^2$. Therefore, the ratio of the upper surface area SB of the chip-mounting lead 1 to the area SA of base of the resin package 7, i.e. SB/SA, is 63.4%. The upper surface area of the chip-mounting internal lead 1 is further increased compared with those of the semiconductor devices S1 and S2 of the first and second embodiments. When the width of the island 4 is equal to the width of the connecting lead 14, the ratio of SB/SA can be further increased, which is effective in extensively improving heat radiation.

The large island 4 and the chip-connecting leads 2 and 3 housed in the semiconductor device S3 also function as a reinforcement, which improves the flexural strength of the semiconductor device S3. This is effective in increasing mechanical strength when the semiconductor device S3 is mounted on an external printed circuit board.

Figure 6:
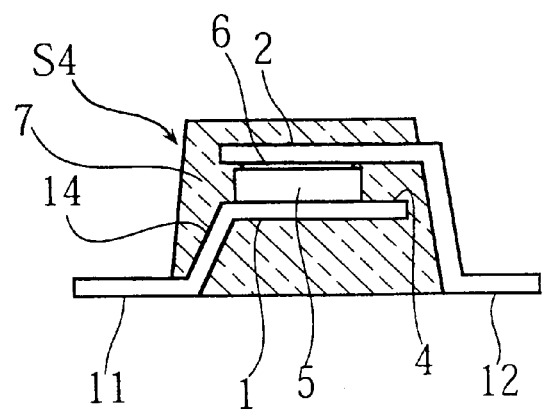
FIG. 6 shows an internal structure of a semiconductor device according to a fourth embodiment of the invention.

FIG. 6 shows an internal structure of a semiconductor device S4 according to a fourth embodiment of the invention. In the foregoing first to third embodiments, the external leads 11 to 13 extend outward near the bottom edge of the bottom of the resin package 7. Therefore, it is difficult to extend the island 4 of the chip-mounting internal lead 1 towards the side of the chip-connecting internal leads 2 and 3 in order to enlarge the area, because the chip-connecting internal leads 2 and 3 themselves prevent such extending.

In the fourth embodiment, external leads 12 and 13 are exposed to the outside from the upper side parts of the resin package 7 in the semiconductor device S4. This enables the island 4 of the chip-mounting internal lead 1 to extend laterally in the resin package 7. Therefore, the ratio of the upper surface area SB of the chip-mounting internal lead 1 to the area SA of the base of the resin package 7 can be increased. It is possible to improve heat radiation by modifying the shapes of the internal leads 1 to 3.

Further, in the semiconductor device S4 of the fourth embodiment, the semiconductor chip 5 is housed at an upper part of the resin package 7. As a result, the connecting lead 14 is lengthened in the resin package 7, compared with the connecting lead of the semiconductor device S3 of the third embodiment. Further, the folded portion of the connecting lead 14 also becomes longer, compared with that of the third embodiment. This effectively increases the upper surface area of the chip-mounting internal lead 1, and improves heat radiation.

Figure 7:
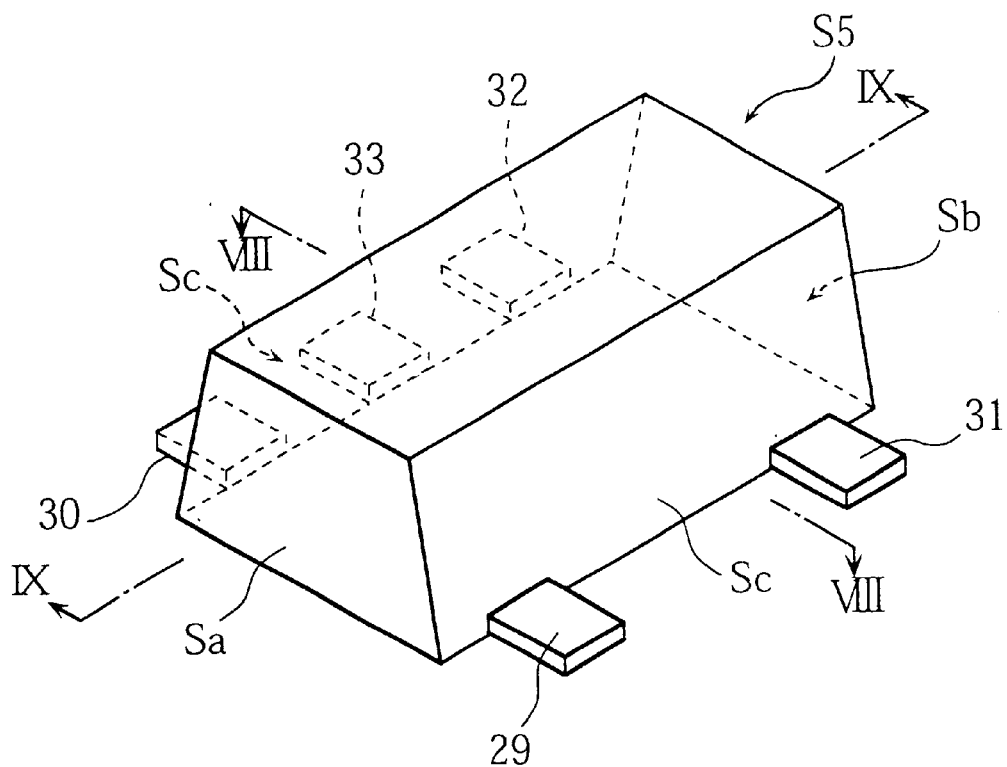
FIG. 7 is a perspective view of a semiconductor device according to a fifth embodiment of the invention.
Figure 8:
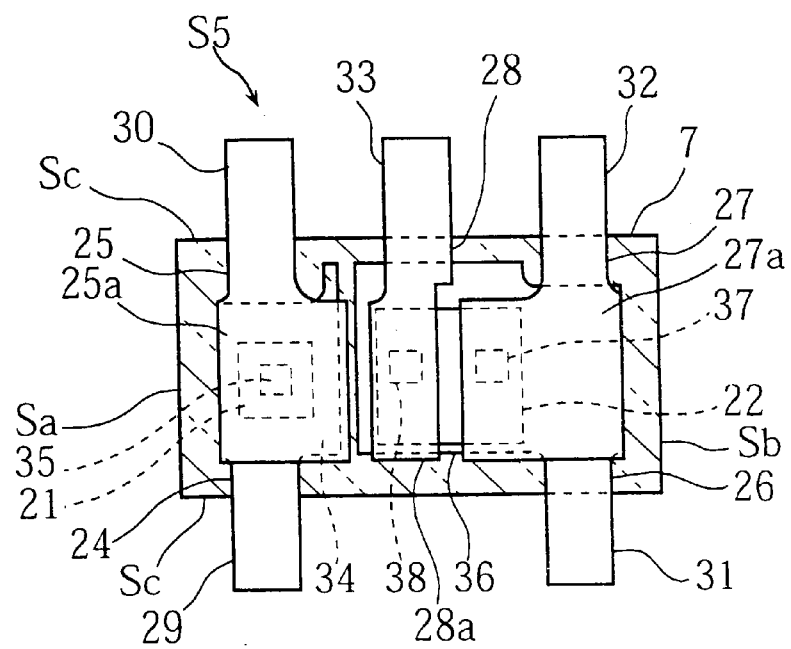
FIG. 8 shows an internal structure of the semiconductor device of FIG. 7, taken along line VIII—VIII.
Figure 9:
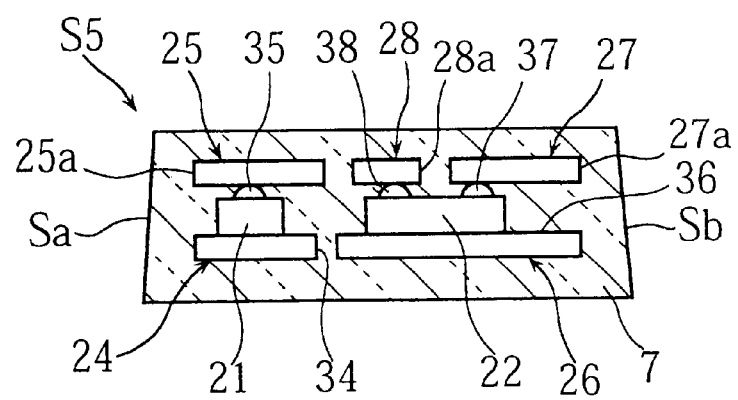
FIG. 9 is a cross section of the semiconductor device of FIG. 7, taken along line IX—IX.

A semiconductor device S5 in a fifth embodiment will be described with reference to FIG. 7 to FIG. 9. The semiconductor device S5 differs from the semiconductor devices S1 to S4 in the number of semiconductor chips, chip-mounting internal leads and chip-connecting internal leads.

The semiconductor device S5 comprises a first semiconductor chip 21 constituted by a diode, and a second semiconductor chip 22 constituted by a transistor. The first semiconductor chip 21 is mounted on a substantially rectangular island 34 provided at one end of a first chip-mounting internal lead 24.

Further, the second semiconductor chip 22 is mounted on an island 36 provided at one end of a second chip-mounting internal lead 26. The island 36 is rectangular or substantially rectangular along the length of the resin package 7.

The islands 34 and 36 are flush with each other in the resin package 7, so that the first and second semiconductor chips 21 and 22 are juxtaposed and are flush with each other.

A first chip-connecting internal lead 25 is connected to the upper surface of the first semiconductor chip 21. Specifically, a substantially rectangular flat part 25a is provided at one end of the first chip-connecting internal lead 25, extends over the first semiconductor chip 21, and is electrically connected to the upper surface of the first semiconductor chip 21 via bump 35.

Second and third chip-connecting internal leads 27 and 28 are connected to the upper surface of the second semiconductor chip 22. Specifically, a substantially rectangular flat part 27a is formed at one end of a second chip-connecting internal lead 27. The flat part 27a overlaps with approximately half of the upper surface of the second semiconductor chip 22, and is electrically connected to the upper surface of the second semiconductor chip 22 via a bump 37.

A third chip-connecting internal leads 28 has a flat part 28a at one end. The flat part 28a overlaps with an approximately half portion of the second semiconductor chip 22, and is electrically connected to the upper surface of the second semiconductor chip 22 via a bump 38.

The semiconductor chips 21 and 22 and the internal leads 24 to 28 are sealed in a substantially rectangular package 7 made of epoxy resin.

The internal leads 24 to 28 are respectively folded at their ends, and connect to external leads 29 to 33 exposed from the resin package 7. A first chip-mounting internal lead 24 and a first chip-connecting internal lead 25 respectively connect to external leads 29 and 30 which are exposed from opposite sides Sc near an end Sa along the length of the resin package 7. Further, a second chip-mounting internal lead 26 and a second chip-connecting internal lead 27 respectively connect to external leads 31 and 32 exposed from the opposite sides Sc near an end Sb along the length of the resin package 7. The external lead 33 extends outward from the side Sc between the external leads 30 and 32.

The first chip-mounting internal lead 24 corresponds to an anode terminal of a diode while the first chip-connecting internal lead 25 corresponds to a cathode terminal of the diode. The second chip-mounting internal lead 26 corresponds to a collector terminal of a transistor while the second chip-connecting internal lead 27 corresponds to a base terminal of the transistor. Further, the third chip-connecting internal lead 28 corresponds to an emitter terminal of the transistor.

In the semiconductor device S5, the semiconductor chips 21 and 22 are mounted on the islands 34 and 36, respectively. The chip-connecting intern al leads 25, 27 and 28 are respectively connected to the upper surfaces of the semiconductor chips 21 and 22, i.e. the semiconductor device S5 employs the wireless structure. Further, the island 34 is wide enough to mount the first semiconductor chip 21.

The island 36 is substantially rectangular, and extends along the length of the resin package 7 together wit h the island 34. The islands 34 and 36 are rectangular or substantially rectangular as a whole. Specifically, the islands 34 and 36 are designed to occupy approximately 50% or more of the area of the base of the resin package 7. In this embodiment, the islands 34 and 36 are enlarged, so that heat generated by the first and second semiconductor chips 21 and 22 can be efficiently radiated outward via the internal leads 24 to 28 or via the resin package 7 in contact with the internal leads 24 to 28.

The semiconductor device S will be laterally enlarged, if the internal leads are substantially flush with one another as in the related art, and if a plurality of semiconductor chips are used. However, when the wireless structure is employed, the semiconductor chips 21 and 22 can be housed in the resin package 7 while suppressing the lateral enlargement of the semiconductor device S5. Therefore, the semiconductor device S5 itself can be made compact.

Figure 10:
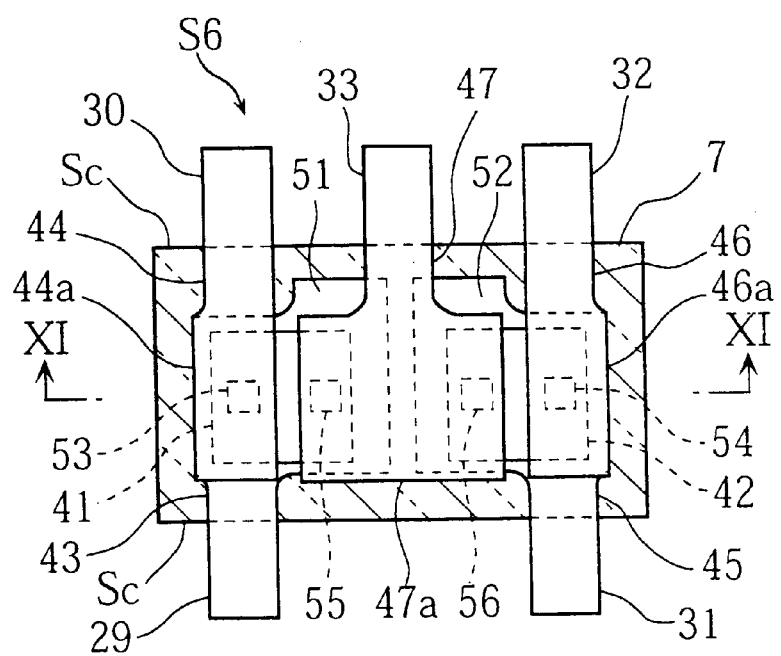
FIG. 10 shows an internal structure of a semiconductor device according to a sixth embodiment of the invention.
Figure 11:
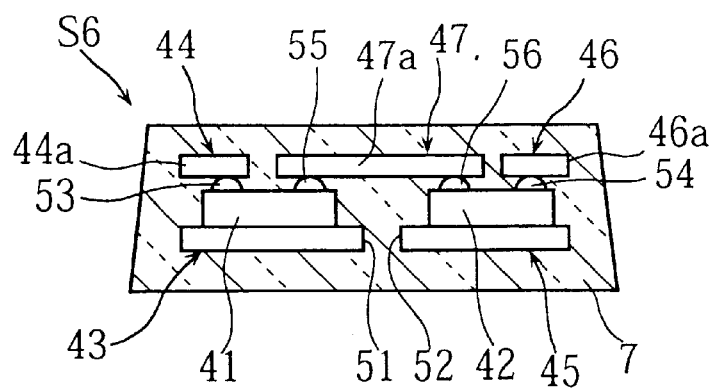
FIG. 11 is a cross section of the semiconductor device of FIG. 10, taken along line XI—XI.

FIGS. 10 and 11 shows an internal structure of a semiconductor device S6 according to a sixth embodiment of the invention. The semiconductor device S6 comprises first and second semiconductor chips 41 and 42 constituted by two transistors. Emitter terminals of the two transistors are used in common as one terminal.

The first semiconductor chip 41 is mounted on an island 51 formed at one end of a first chip-mounting internal lead 43. The island 51 is rectangular or substantially rectangular along the length of a resin package 7.

The second semiconductor chip 42 is mounted on an island 52 formed at one end of a second chip-mounting lead 45. The island 52 is rectangular or substantially rectangular and extends along the length of the resin package 7.

The islands 51 and 52 are juxtaposed at the same level in the resin package 17, and have their ends positioned close to each other. Therefore, the first and second semiconductor chips 41 and 42 are juxtaposed so as to be flush with each other.

A first chip-connecting internal lead 44 is connected to an upper surface of the first semiconductor chip 41. The first chip-connecting internal lead 44 is provided with a flat part 44a at one end. The flat part 44a is positioned over the first semiconductor chip 41, and is electrically connected to the upper surface of the first semiconductor chip 41 via a bump 53.

A second chip-connecting internal lead 46 is connected to an upper surface of the second semiconductor chip 42. The second chip-connecting internal lead 46 is provided with a flat part 46a at its one end. The flat part 46a is positioned over the second semiconductor chip 42, and is electrically connected to the upper surface of the second semiconductor chip 42 via a bump 54.

A third chip-connecting internal lead 47 is connected to the upper surfaces of the semiconductor chips 41 and 42. Specifically, the third chip-connecting internal lead 47 has a substantially rectangular flat part 47a at one end thereof. The flat part 47a extends over and is electrically connected to the semiconductor chips 41 and 42 via bumps 55 and 56. The islands 51 and 52 are positioned at the same level in the resin package 7, so that the first and second semiconductor chips 41 and 42 are flush with each other. Therefore, the second chip-connecting internal lead 47 can be connected to and can extend across the semiconductor chips 41 and 42.

The first chip-mounting internal lead 43 corresponds to a collector terminal of one of the transistors while the first chip-connecting internal lead 44 corresponds to a base terminal of the transistor. The second chip-mounting internal lead 45 corresponds to a collector terminal of the other transistor while the second chip-connecting internal lead 46 corresponds to a base terminal of the transistor. The third chip-connecting internal lead 47 corresponds to emitter terminals of the transistors, i.e. the emitter terminals of the transistors are used in common via the third chip-connecting internal lead 47.

The islands 51 and 52 are rectangular or substantially rectangular along the length of the resin package 7. The semiconductor device S6 can be enlarged by widening the islands 51 and 52, as in the foregoing embodiments. Further, it is possible to efficiently radiate heat generated by the semiconductor chips 41 and 42 to the exterior. Still further, when the wireless structure is employed, the two transistors constituted by approximately 9.0 mm semiconductor chips can be housed in the semiconductor device.

The emitter terminals of the transistors are used in common, which is effective in reducing the number of terminals to be exposed from the semiconductor device S6 and a component cost. Alternatively, either collector or base terminals may be used in common in the semiconductor device S6.

Figure 12:
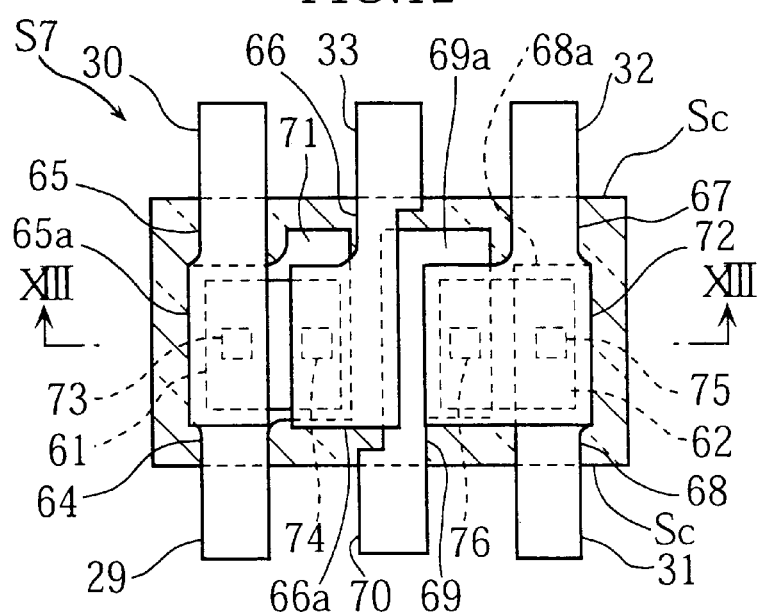
FIG. 12 shows an internal structure of a semiconductor device according to a seventh embodiment of the invention.
Figure 13:
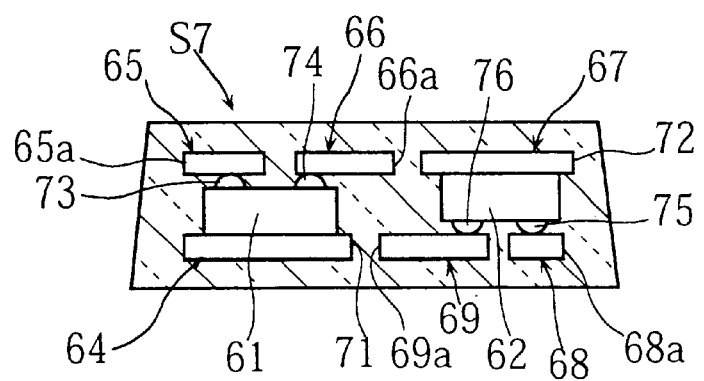
FIG. 13 is a cross section of the semiconductor device of FIG. 12, taken along line XIII—XIII.

In a seventh embodiment, a semiconductor device S7 has an internal structure as shown in FIGS. 12 and 13. The semiconductor device S7 comprises first and second semiconductor chips 61 and 62 constituted by two transistors, as in the semiconductor device S6 of the sixth embodiment.

The semiconductor chips 61 and 62 are housed in a resin package 7 with their upper surfaces facing in opposite directions.

The first semiconductor chip 61 is mounted on a substantially rectangular island 71 which is formed at one end of a first chip-mounting lead 64 and extends along the length of the resin package 7. The island 71 is positioned near the bottom of the resin package 7.

The first and second chip-connecting leads 65 and 66 are provided with flat parts 65a and 66a at one end each thereof. The flat parts 65a and 66a are positioned over the semiconductor chip 61, and are electrically connected to the upper surface of the semiconductor chip 61 via bumps 73 and 74, respectively.

The second semiconductor chip 62 is mounted on a rectangular island 72 formed at one end of the second chip-mounting lead 67. The island 72 is positioned near the upper part of the resin package 7. In this embodiment, the semiconductor chip 62 is mounted on the island 72 in a different manner from that of the semiconductor chip 61. Specifically, the semiconductor chip 61 is die-bonded onto the upper surface of the island 71, for example, while the semiconductor chip 62 is die-bonded onto the underside of the island 72, for example.

Third and fourth chip-connecting internal leads 68 and 69 are electrically connected to the underside of the second semiconductor chip 62. The chip-connecting internal leads 68 and 69 are respectively provided with flat parts 68a and 69a at one end each, which overlap with the underside of the semiconductor chip 62, and are electrically connected thereto via bumps 75 and 76, respectively.

The internal leads 64 to 68 respectively connect to external leads 29 to 33 exposed out of the resin package 7. A fourth chip-connecting internal lead 69 connects to an external lead 70 extending outward from a side Sc between the external leads 29 and 31.

The first chip-mounting internal lead 64 corresponds to a collector terminal of one of the transistors while the first chip-connecting internal lead 65 corresponds to a base terminal of the transistor. The second chip-connecting internal lead 66 corresponds to an emitter terminal of the transistor. The second chip-mounting internal lead 67 corresponds to a collector terminal of the other transistor. The third chip-connecting internal lead 68 corresponds to a base terminal of the transistor. The fourth chip-connecting internal lead 69 corresponds to an emitter terminal.

In the semiconductor device S7 of the seventh embodiment, the semiconductor chips 61 and 62 are housed in the resin package 7 with their upper surfaces facing in opposite directions. The islands 71 and 72 are rectangular or substantially rectangular along the length of the resin package 7. Therefore, as with the semiconductor device 56 of the sixth embodiment, the islands 71 and 72 can be enlarged, which is effective in radiating heat generated by the semiconductor chips 61 and 62.

Further, in the semiconductor device S7, the island 71 is positioned near the bottom of the resin package 7 while the island 72 is positioned near the upper part of the package 7. Therefore, the semiconductor chips 61 and 62 are longitudinally separated in the resin package 7. This is effective in improving the radiation of heat from the semiconductor chips 61 and 62 via the chip-mounting leads 64 and 67, compared with the case where the internal leads 64 to 69 are eccentrically positioned in the resin package 7.

In the semiconductor devices S5 to S7 of the fifth to seventh embodiments, the semiconductor chips are vertically sandwiched between the internal leads. Therefore, each semiconductor device can improve its heat radiation and be provided with a plurality of semiconductor chips. Needless to say, the number of semiconductor chips is not always limited to two. More semiconductor chips may be provided in the semiconductor device. In such a case, two, seven or more external leads may extend out of each of the semiconductor devices S5 to S7.

Figure 14:
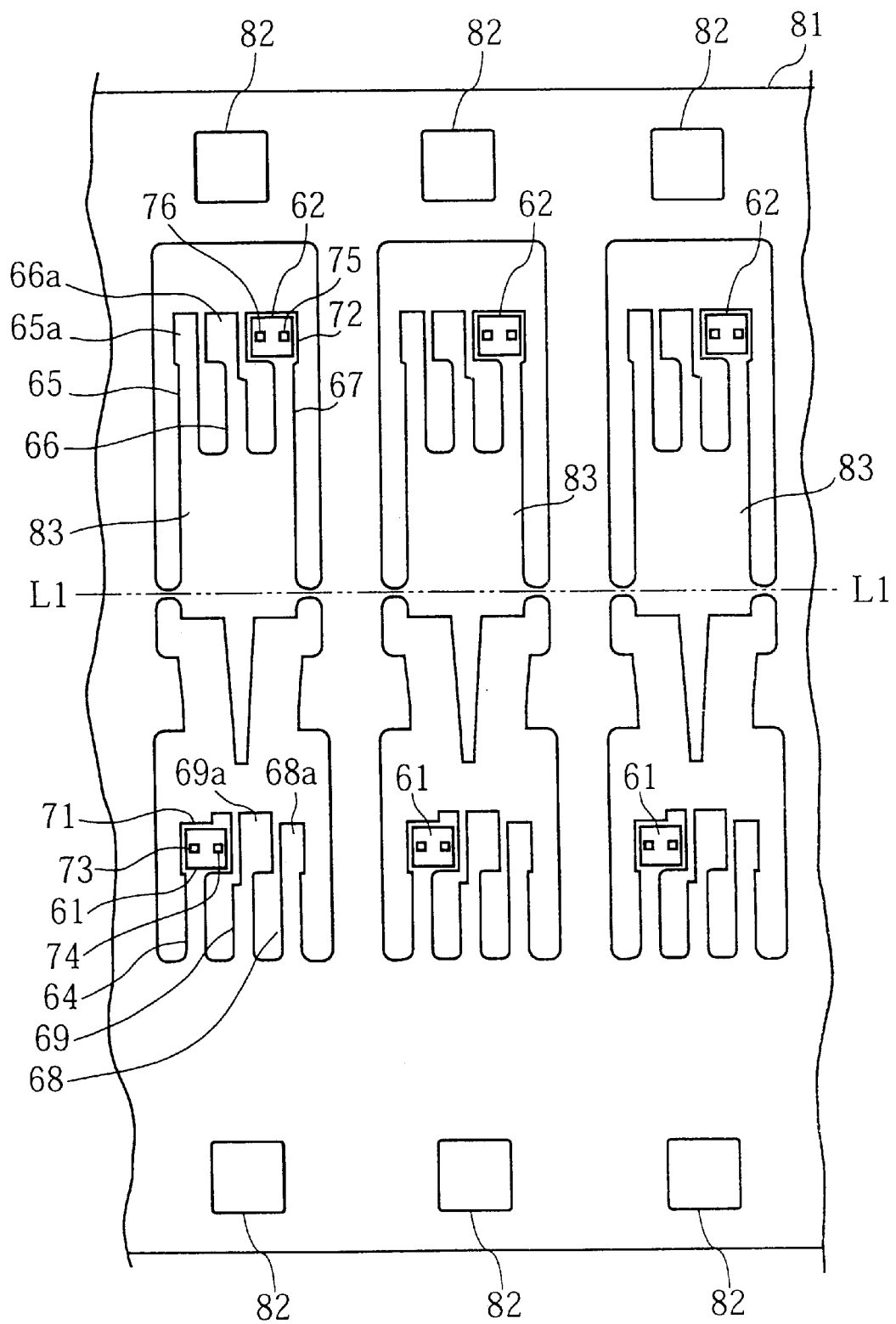
FIG. 14 shows a method of manufacturing the semiconductor device of FIG. 12.

The semiconductor device S7 of the seventh embodiment will be made as described hereinafter. Referring to FIG. 14, a thin film strip 81 made of copper is punched, pressed and shaped, thereby obtaining parts which are used as the internal leads 64 to 69 and the external leads 29 to 33 and 70. In this case, the chip-mounting internal leads 64 and 67 are shaped in order to have the rectangular islands 71 and 72 at their ends. In FIG. 14, reference numeral 82 denotes feed holes.

Thereafter, the semiconductor chips 61 and 62 are connected onto the islands 71 and 72 using an adhesive, for example. The bumps 73 to 76 made of Ag, for example, are formed to grow on the semiconductor chips 61 and 62.

Figure 15:
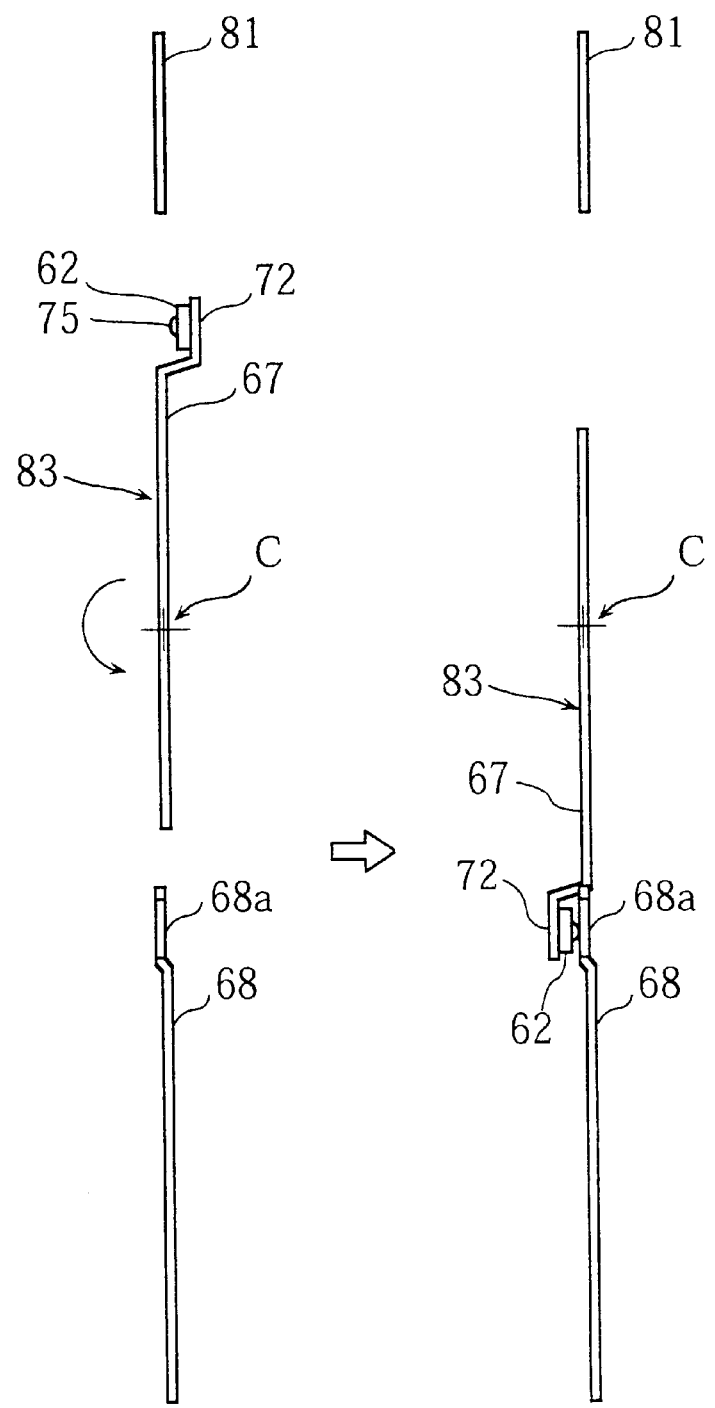
FIG. 15 shows a further process in the method of manufacturing the semiconductor device of FIG. 12.

The thin film strip 81 is folded at a dot-and-dash line L1 extending along the length thereof. Referring to FIG. 15, a piece 83 of the thin film strip 81 is reversed at a point C as a rotation axis. In this state, the bumps 75 and 76 of the semiconductor chip 62 are connected to the flat parts 68a and 69a of the chip-connecting internal leads 68 and 69. Further, the bumps 73 and 74 of the semiconductor chip 62 are connected to the flat parts 65a and 66a of the chip-connecting internal leads 65 and 66. The size of the pieces 83 of the thin film strip 81 is determined so that the semiconductor chips 61 and 62 can be appropriately connected to the flat parts 65a, 66a, 68 and 69a via the bumps 73 to 76.

The semiconductor chips 61 and 62 and the internal leads 64 to 69 are packed in a thermosetting resin, which serves as the resin package 7. The exposed external leads 29 to 33 and 70 are soldered and die-bonded in order to remove unnecessary parts, so that the semiconductor device S7 can be made as shown in FIGS. 12 and 13.

The piece 83 of the thin film strip 81 is folded in order that the semiconductor chips 61 and 62 can be reliably connected to the flat parts 65a, 66a, 68a and 69a of the internal leads 65, 66, 68 and 69. The foregoing manufacturing method is also applicable to the semiconductor devices S1 to S6 in the first to sixth embodiments.

Needless to say, the present invention is not limited to the above embodiments. For instance, the semiconductor chips are not limited to diodes or transistors. For example, diodes may be switching diodes, Schottky barrier diodes and so on. Other kinds of diodes are also applicable. Further, transistors may be MOSFETs, bipolar transistors and so on. Other kinds of transistors are also usable.

What is claimed is:

1. A semiconductor device comprising a semiconductor chip, a chip-mounting internal lead for mounting the semiconductor chip thereon, chip-connecting internal leads connected directly to an upper surface of the semiconductor chip, and a rectangular resin package housing the semiconductor chip and the internal leads, wherein the chip-mounting internal lead includes an end which is rectangular or substantially rectangular and extends lengthwise of the resin package, wherein the resin package includes a pair of side surfaces spaced apart from each other in a longitudinal direction of the resin package, wherein the end of the chip-mounting lead includes a pair of edges spaced apart from each other in the longitudinal direction of the resin package, wherein each of the edges of the chip-mounting lead is closer to a corresponding one of the side surfaces of the resin package than to the semiconductor chip, and wherein a surface area of the chip-mounting lead is no less than 50% of a bottom area of the resin package.

2. The semiconductor device according to claim 1, wherein the semiconductor chip is mounted at an intermediate portion of the chip-mounting internal lead extending lengthwise of the resin package.

3. The semiconductor device according to claim 1, wherein a non-end portion of the chip-mounting lead has a width which is equal to a width of the end.

4. A semiconductor device comprising first and second semiconductor chips, first and second chip-mounting internal leads for mounting the first and second semiconductor chips, respectively, a plurality of chip-connecting internal leads electrically connected to upper surfaces of the first and second semiconductor chips, and a rectangular resin package housing the first and second semiconductor chips and the first and second internal leads, wherein each of the first and second chip-mounting internal leads includes an end which is rectangular or substantially rectangular and extends lengthwise of the resin package, and the end of each of the chip-mounting leads is no less than 50% of a bottom area of the resin package.

5. The semiconductor device according to claim 4, wherein the ends of the first and second chip-mounting internal leads are positioned in a common plane to juxtapose the semiconductor chips in the resin package.

6. The semiconductor device according to claim 4, wherein an end of the chip-connecting internal leads extends over upper surfaces of the first and second semiconductor chips so as to connect the upper surfaces of the semiconductor chips to each other.

7. The semiconductor device according to claim 4, wherein the semiconductor chips are arranged in the resin package with their upper and lower surfaces alternating with each other, wherein the end of the first chip-mounting internal lead is positioned adjacent to a bottom of the resin package; and wherein the end of the second chip-mounting internal lead is positioned adjacent to an upper surface of the resin package.

8. A semiconductor device comprising a semiconductor chip, a chip-mounting internal lead for mounting the semiconductor chip thereon, chip-connecting internal leads electrically connected to an upper surface of the semiconductor chip, and a rectangular resin package housing the semiconductor chip and the internal leads, wherein the chip-mounting internal lead includes an end which is rectangular or substantially rectangular and extends lengthwise of the resin package, wherein a surface area of the chip-mounting lead is no less than 50% of a bottom area of the resin package, and wherein a non-end portion of the chip-mounting lead has a width which is equal to a width of the end.

* * * * *